United States Patent
Christensen et al.

(10) Patent No.: US 6,774,734 B2
(45) Date of Patent: *Aug. 10, 2004

(54) RING OSCILLATOR CIRCUIT FOR EDRAM/ DRAM PERFORMANCE MONITORING

(75) Inventors: Todd Alan Christensen, Rochester, MN (US); Terrance Wayne Kueper, Rochester, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/306,200

(22) Filed: Nov. 27, 2002

(65) Prior Publication Data

US 2004/0100336 A1 May 27, 2004

(51) Int. Cl.[7] .................................................. H03B 1/00
(52) U.S. Cl. ..................................... 331/57; 365/189.01
(58) Field of Search ....................... 331/57; 365/189.01, 365/226

(56) References Cited

U.S. PATENT DOCUMENTS

| | | | | |
|---|---|---|---|---|
| 5,349,562 A | * | 9/1994 | Tanizaki | 365/222 |
| 5,828,258 A | * | 10/1998 | Ooishi et al. | 327/291 |
| 5,898,343 A | * | 4/1999 | Morgan | 331/57 |
| 6,134,152 A | * | 10/2000 | Mullarkey | 365/189.01 |
| 6,538,522 B1 | * | 3/2003 | Aipperspach et al. | 331/57 |

OTHER PUBLICATIONS

Patent Application Serial Number 09/977423, Method and Ring Oscillator for Evaluating Dynamic Circuits, Anthony G. Aipperspach et al., filed Oct. 15, 2001.

* cited by examiner

Primary Examiner—Robert Pascal
Assistant Examiner—Joseph Chang
(74) Attorney, Agent, or Firm—Robert R. Williams (57) ABSTRACT

Circuitry and methods are disclosed for quantitatively characterizing the delay of Embedded Dynamic Random Access Memory (EDRAM) and Dynamic Random Access Memory (DRAM). The performance critical portion of the memory is placed in a ring oscillator designed such that the delay through the portion, from a rising input to the memory to a rising output, can be accurately determined. Recently, such memory elements have begun to be implemented on chips along with high-speed logic circuitry. However, the performance characteristics of the memory elements do not track the performance characteristics of the logic circuitry. The current invention allows the memory performance to be characterized along with, or separately from, characterization of the logic circuitry.

13 Claims, 8 Drawing Sheets

RING OSCILLATOR CIRCUIT FOR EDRAM/ DRAM PERFORMANCE MONITORING

RELATED APPLICATIONS

Application Ser. No. 09/977,423, commonly owned by the assignee at the time of the invention. Application Ser. No. 09/977/423 is hereby included by reference in its entirety.

FIELD OF THE INVENTION

The present invention relates to testing of dynamic random access memories (DRAMs). More particularly, the present invention relates to performance measurements of key portions of a DRAM.

DESCRIPTION OF RELATED ART

Historically, semiconductor chips used in electronic systems, including, but not limited to, computers and controllers, have been of two main types. A first type of chip is built with a process optimized for high-speed logic. The actual speed of "High-speed logic" has been constantly increasing for many years; at any point in time, high-speed logic is the logic used for leading-edge computer, controller, and Application Specific Integrated Circuit (ASIC) products. Currently, such high-speed logic is implemented in Complementary Metal Oxide Semiconductor (CMOS) semiconductor processes. Short Field Effect Transistor (FET) channel length and very thin gate oxide thickness, as well as low FET threshold voltage are typical characteristics of CMOS FETs that are optimized for very high speed. Process technology advances usually comprise improvements in some or all of these characteristics.

A second type of chip is built in a process optimized for dense data storage and length of data retention in dynamic random access memory (DRAM). A DRAM technology stores information by placing (or not placing) charge on a capacitor to write the information. Later, during a read operation, the presence (or absence) of charge on the capacitor is sensed. A requirement of such DRAM data storage is that the capacitor must retain the charge for a significant period of time. Eventually, DRAM capacitors lose charge through leakage mechanisms and must be periodically refreshed. During refresh periods, the data cannot be read. Therefore, higher memory availability (and higher system throughput) results from longer data retention by the DRAM capacitors. A DRAM storage cell, shown in FIG. 1, comprises a storage capacitor, a strap resistance, and a DRAM transistor. A drain of the DRAM transistor is coupled to a bitline; a gate of the DRAM transistor is coupled to a wordline.

The DRAM transistor is not required to provide ultrahigh speed; rather, it must be designed to keep leakage currents small, thereby extending retention time of charge placed through the DRAM transistor from the bitline into the storage capacitor. DRAM transistors typically have relatively high FET thresholds, compared to FET thresholds of FETs used in high-speed logic. DRAM transistors also typically have thicker gate oxides and longer channel lengths than FETs used in high-speed logic.

Read performance of the DRAM storage cell depends largely on the DRAM transistor, the value of the strap resistance, and the capacitance of the storage capacitor. If a "0" is written into the DRAM storage cell by discharging the storage capacitor, the "0" is read by charging the bitline to a "1" and then floating the bitline. Floating the bitline means removing active drive from the bitline. When floated, capacitance on the bitline maintains the bitline voltage at substantially the voltage to which the bitline was charged. Then, the wordline is activated, turning on the DRAM transistor. A charge redistribution occurs between the precharged bitline and the discharged (i.e., "0") storage capacitor. The redistribution has to flow through the DRAM transistor and the strap resistance. A high strap resistance value and/or a slow DRAM transistor makes the DRAM storage cell read slower; a low strap resistance and/or a fast DRAM transistor makes the DRAM storage cell read faster. A storage capacitor with a larger capacitance value causes the bitline to fall further, in which case, voltage on the bitline will reach a switching threshold on a sense amplifier (to be shown and discussed later) in a shorter period of time. The value of the storage capacitor, the value of the strap resistance, and the characteristics of the DRAM transistor all are parameters that vary from chip to chip as semiconductor chips are processed in a semiconductor processing factory. Therefore, DRAM storage cells will be faster on some chips than on other chips.

In recent years, DRAM memory has been placed on high-speed logic chips. DRAM memory is much denser than static random access memory (SRAM). Although SRAM is typically used for level-1(L1) cache memory on high-speed logic chips such as processors, the density advantage of DRAM often justifies the use of DRAM, especially for embedded level-2 (L2) cache, where bandwidth and memory capacity are more important than latency. To achieve both high speed in the logic and long data retention time in the DRAM, such products typically use a process with short channel, low threshold voltage, thin gate oxide FETs for the high-speed logic. Such products also incorporate longer channel, higher threshold voltage, thicker gate oxide FETs for the DRAM transistors. Typically, special process steps are also used to produce relatively high capacitance DRAM storage capacitors. Even though a CMOS process capable of putting both types of FETs on the same chip is more complex—and therefore more expensive—performance improvements in the system, and possibly, savings in interface area costs from not having separate DRAM memory chips often justifies the use of embedded DRAM on high-speed logic chips.

A technique long used to characterize performance of circuits on semiconductor chips is to place a number of the circuits in a ring oscillator. Ring oscillators typically include a series of devices or stages connected together to form a ring with a feedback path provided from the output of the last of the series of devices to an input of the first device in the series of devices. The devices may include logic gates, inverters, differential buffers, or differential amplifiers, for example. Any inverting path with sufficient gain will oscillate when connected in a ring, while a non-inverting path will simply lock on a particular starting logic level. The ring oscillator is essentially a series of stages, each stage having an intrinsic delay from input to output. The frequency of the ring oscillator output is a function of the total delay time of the series of stages. Such ring oscillators have been common in ASICs and processors to determine the speed characteristics of a particular chip.

Devices of similar design track well across a semiconductor chip. That is, if a ring oscillator built out of inverters that are designed with high-speed logic performs "fast", all logic circuits on a particular chip utilizing similar high-speed logic will also perform "fast". Some variation may be expected and the variation can be quantified in any given process. Placement of several ring oscillators at different areas of a chip design allows the designer to account for "cross-chip" variations in performance. In very localized regions of a chip, parameters such as channel lengths track extremely well from one FET to another. Tracking of parameters between FETs at widely separated areas on a chip do not track as well as FETs that are very close. However, even FETs that are widely separated on a chip track better than chips processed on different wafers produced on different process lots, or even the same process lot.

Knowing the speed characteristics of a particular chip is valuable in order that the chip can be categorized as, for example, "fast", "nominal", or "slow". Fast product can often be sold for a higher price than a nominal or slow product, thus making it important to know the speed characteristics. Such speed differentiation is sometimes known as "speed sorting", or "bucketing".

When both high-speed logic circuits and embedded DRAM (EDRAM) exists on a single chip, both types of circuits must be characterized, since there is no significant tracking in characteristics between the dissimilar devices used in the high-speed logic circuits and the devices used in the DRAM storage cells. For example, even if the high-speed logic circuits are characterized as "fast", the DRAM storage cells might be slow, and the chip could not be categorized as "fast".

There are classes of circuits in which the measured performance of only one of the input transitions is desired. These classes of circuits include, for example, dynamic circuits, memory paths, and the like. Application Ser. No. 09/977,423 earlier included in its entirety, describes a method and ring oscillator suitable for evaluating dynamic circuits. Application Ser. No. 09/977,423 teaches measuring performance of circuits in which the measured performance of only one of the input transitions is desired; however, application Ser. No. 09/977,423 does not teach a circuit configuration or method for characterizing the performance of a DRAM storage cell.

Therefore, there is a need for a method and apparatus suitable for characterizing the performance of a DRAM storage cell.

SUMMARY OF THE INVENTION

In brief, a method and circuitry is disclose that provide for inclusion of a DRAM storage cell as a determinate portion of a ring oscillator's frequency. The circuitry includes necessary timing and control elements that ensure that the DRAM storage cell is precharged when it needs to be precharged, reset when it needs to be reset, and read in a way that the delay of the DRAM storage cell can be determined. The present invention discloses a method and apparatus suitable for characterizing the performance of a DRAM storage cell.

In an embodiment, semiconductor chip comprises a DRAM storage cell placed in a ring oscillator that measures performance of the DRAM storage cell.

In an exemplary embodiment of the ring oscillator on this semiconductor chip, a determinant of the ring oscillator's frequency is the time needed by the DRAM storage cell to discharge a bitline capacitance to a predetermined voltage.

In another exemplary embodiment of the ring oscillator on this semiconductor chip, a DRAM storage cell's storage capacitor is discharged, and a bitline is charged. Subsequently, a word line is activated, causing charge redistribution to occur between the bitline and the storage capacitor, with current flowing through a DRAM transistor and a strap resistance.

In a further embodiment, the DRAM storage cell is bypassed in the ring oscillator, allowing computation of ring oscillator period difference between the period with the DRAM storage cell delay and without the DRAM storage cell delay.

BRIEF DESCRIPTION OF THE DRAWINGS

FIG. 6A shows a set of waveforms that would be seen in FIGS. 7 and 8, using the circuitry shown in FIG. 5 used as the "DRAM circuit under test". FIG. 6A shows the waveforms in "steady state", that is, following initialization.

FIG. 6B shows the waveforms at initialization time.

DETAILED DESCRIPTION OF THE PREFERRED EMBODIMENTS

Having reference now to the figures, the invention will now be described in detail.

Figure 1:
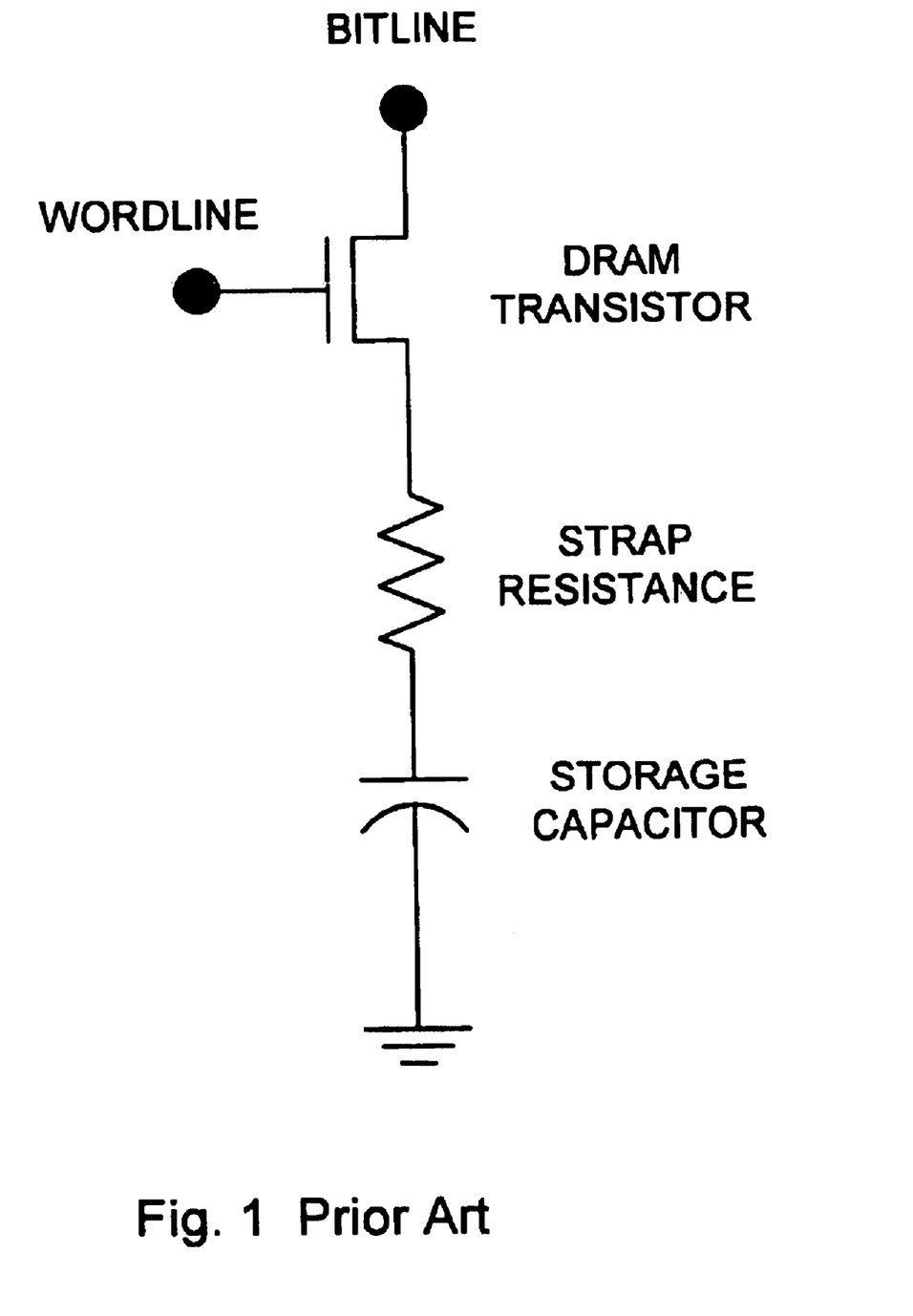
FIG. 1 shows a conventional DRAM storage cell, comprising a DRAM transistor, a strap resistance, and a storage capacitor. Bitline and wordline ports are shown.

FIG. 1, as described earlier, shows a conventional DRAM storage cell. A storage capacitor is written—charged (or discharged)—through a strap resistance and a DRAM transistor. For example, when a bitline is driven to a high voltage, the storage capacitor is charged to the high voltage (minus a Field Effect Transistor (FET) threshold voltage, in the circuit shown) when a wordline is driven high, activating the DRAM transistor. Similarly, if the bitline is at a low voltage, the storage capacitor is discharged to the low voltage. Later, the DRAM storage cell can be read by sensing the presence or absence of charge on the storage capacitor.

As described earlier, due to normal semiconductor process variations of the DRAM transistor, the strap resistance, and the storage capacitor, performance of the DRAM storage cell varies from chip to chip. Due to tracking, all similar DRAM storage cells on a particular chip will have similar performance.

Figure 2:
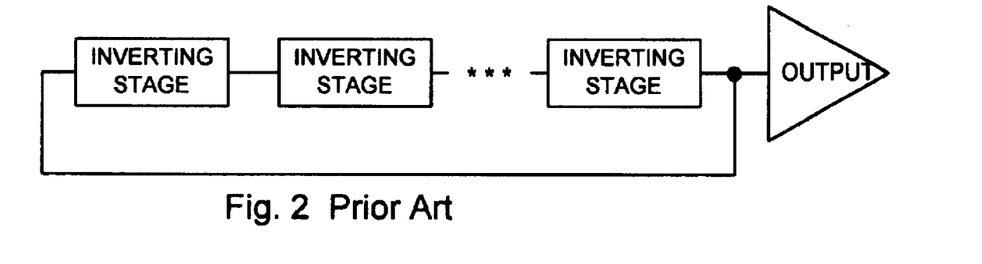
FIG. 2 shows a conventional ring oscillator comprising a number of inverting stages, the period of which is determined by delays from both rising and failing transitions at each stage.

FIG. 2 shows a conventional ring oscillator comprising a number of inverting stages. Feedback from an end of the ring oscillator comprising an odd number of the inverting stages back to the front of the ring oscillator causes the ring oscillator to oscillate at a frequency dependent on an intrinsic delay of each stage, with both delays from rising transitions and falling transitions determining the period of the oscillation. An output buffer repowers a signal at a node, typically the end, of the ring oscillator, for frequency measurement off-chip of the ring oscillator. Advantageously, the ring oscillator is initialized. For example, a ring oscillator comprising a number of inverters as the inverting stages can be initialized by use of a NAND or a NOR circuit (not shown) as one of the stages, with one of the inputs to the NAND or NOR being coupled to an initialization logic signal.

Figure 3A:
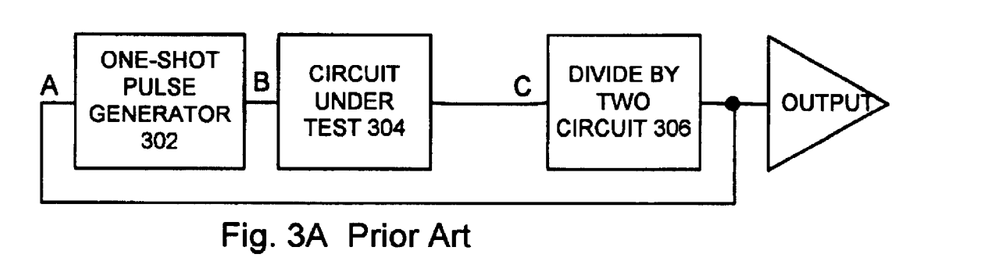
FIG. 3A shows a ring oscillator as taught in application Ser. No. 09/977,423, which has been included by reference. This ring oscillator has a period determined by delays from only a single transition direction.
Figure 3B:
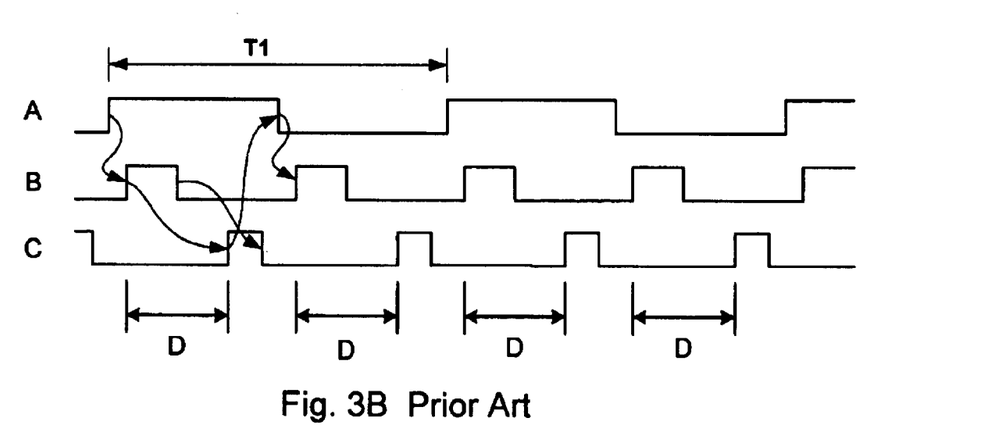
FIG. 3B shows a set of waveforms at points in the ring oscillator shown in FIG. 3A.

FIG. 3A shows a ring oscillator as taught in Ser. No. 09/977,423, which has been included in its entirety by reference. The ring oscillator in FIG. 3A has a period sensitive to delays in circuit under test 304 respondent to transitions in a single direction. Such a ring oscillator is valuable in determining delays of certain classes of circuits, such as precharged domino logic, as described in Ser. No. 09/977,423. An exemplary set of waveforms that would be seen in such a ring oscillator is shown in FIG. 3B. Again, advantageously, some form of initialization is provided (not shown in FIG. 3A). One-shot pulse generator 302 provides a pulse of predetermined width. In FIG. 3B, either a rising edge of signal A or a falling edge of signal A produces such a pulse on signal B. Circuit under test 304 responds to a rising edge of signal B. As depicted, the rising edge on signal B produces—after a delay in circuit under test 304—a rising edge on signal C. Signal C, in turn, is input to divide by two circuit 306. Divide by two circuit 306 responds to rising edges of signal C with alternating transitions, which are fed back as signal A. The delay of circuit under test 304 is shown as delay D in FIG. 3B.

Figure 4A:
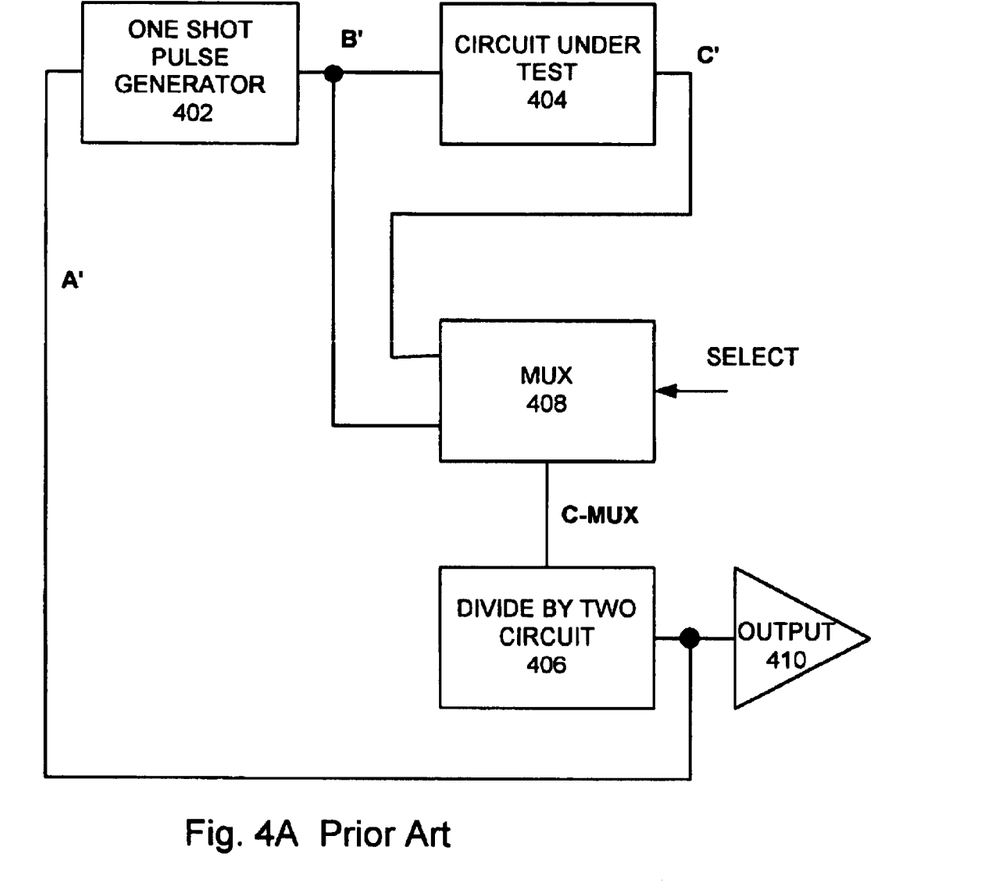
FIG. 4A shows a block diagram as taught in application Ser. No. 09/977,423, which has been included by reference, showing how the circuit under test in the ring oscillator can be bypassed by a multiplexer.
Figure 4B:
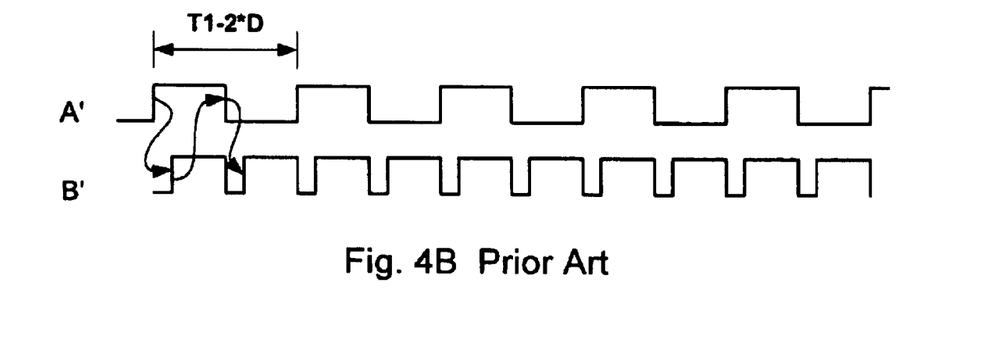
FIG. 4B shows a set of waveforms at points in the ring oscillator shown in FIG. 4A, with the circuit under test bypassed by the multiplexer.

One-shot pulse generator 302 and divide by two circuit 306 shown in FIG. 3A are also sources of delay, although with proper design, these delays can be made small in comparison to the delay of circuit under test 304. However, the block diagram shown in FIG. 4A, also disclosed in application Ser. No. 09/997,423, reveals a technique to isolate the delay of circuit under test 304. A multiplexer 408 has been provided. One-shot pulse generator 402 is the same as one-shot pulse generator 302 in FIG. 3A, and produces signal B'. Circuit under test 404 is the same as circuit under test 304 in FIG. 3A. Divide by two circuit 406 is the same as divide by two circuit 306 in FIG. 3A. With multiplexer 408 selecting signal C' (C' being the same signal as signal C in FIG. 3A), and passing signal C' as C-Mux, the ring oscillator includes the delay of one-shot pulse generator 402, circuit under test 404, multiplexer 408, and divide by two circuit 406. A first frequency of operation in this first mode is noted. Subsequently, the select signal is switched so that multiplexer 408 selects signal B' (B' being the same signal as signal B in FIG. 3A) for passing as signal C-Mux to divide by two circuit 406. In this mode, the ring oscillator includes the delay of one-shot pulse generator 402, multiplexer 408, and divide by two circuit 406. A second frequency of operation in this second mode is noted. The difference between the first frequency and the second frequency provides the delay of circuit under test 404. Exemplary waveforms of the first mode are as in FIG. 3B; exemplary waveforms of the second mode are as in FIG. 4B. As is customary in the literature, curved-line arrows indicate cause/effect relationships between one waveform and another. As shown in FIG. 3B, the period of the ring oscillator is "T1". "D" indicates the delay of circuit under test 404, receiving a rising input and producing a rising output in response. FIG. 4B shows the frequency of the ring oscillator when multiplexer 408 selects signal B' to be passed to divide by two circuit 406. The period in FIG. 4B is T1-2*D.

DRAM storage cells require a significant amount of control logic to operate. Well-documented timing requirements must be satisfied. The present invention provides a DRAM circuit under test 500, shown in FIG. 5, suitable for use in ring oscillators, as will be described below, with exemplary waveforms from nodes in DRAM circuit under test while in operation shown in FIGS. 6A and 6B.

Figure 5:
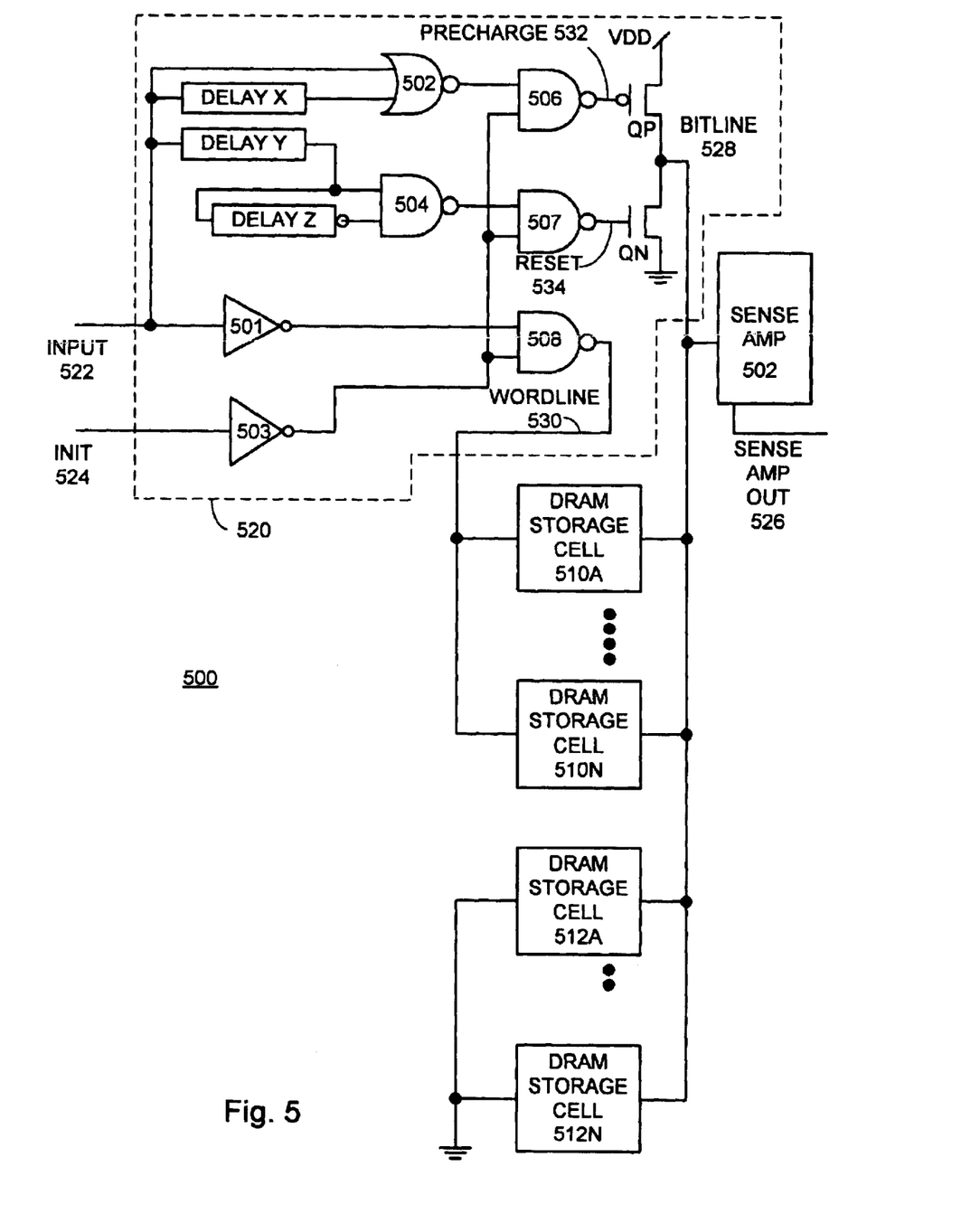
FIG. 5 shows an exemplary block diagram, according to the teaching of the present invention, of an apparatus suitable to determine the performance of a DRAM storage cell. This block diagram comprises circuitry found in the "DRAM circuit under test" in FIGS. 7 and 8.

DRAM circuit under test 500 is designed to receive a rising input and, after a delay, produce a rising output DRAM circuit under test 500, therefore, can be used as a delay-determining element in a manner similar to the circuit under test 304 or 404 described above.

Figure 7:
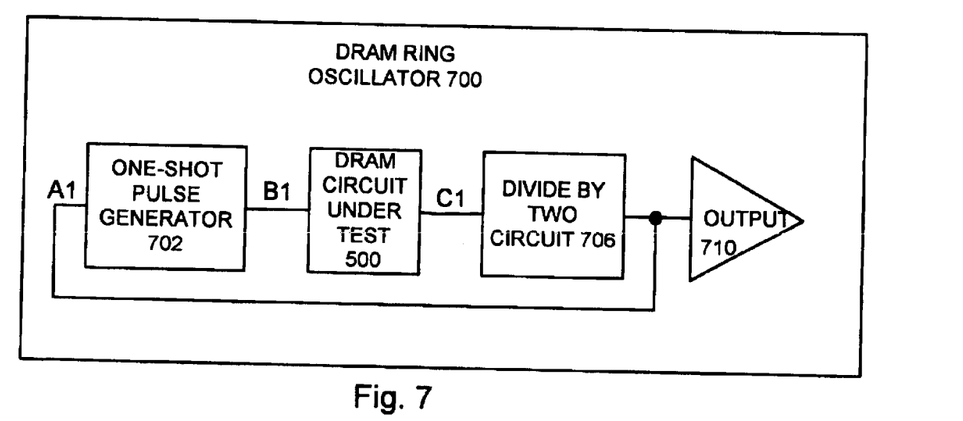
FIG. 7 shows a DRAM ring oscillator suitable to determine performance of the DRAM circuit under test.

The DRAM circuit under test is serially coupled in DRAM ring oscillator 700 shown in FIG. 7, and is a determinate of the frequency of DRAM ring oscillator 700. In another embodiment, DRAM circuit under test 500 is shown serially coupled in multiplexed DRAM ring oscillator 800 in FIG. 8, and is a determinate of the frequency of multiplexed DRAM ring oscillator 800. A major component of the delay of DRAM circuit under test 500 is the "reading" of a stored "0" on the storage capacitor of the DRAM storage cell. Therefore, the "read" time of the DRAM storage cell is a major determinate of the frequency of DRAM ring oscillator 700 and of multiplexed DRAM ring oscillator 800.

Figure 8:
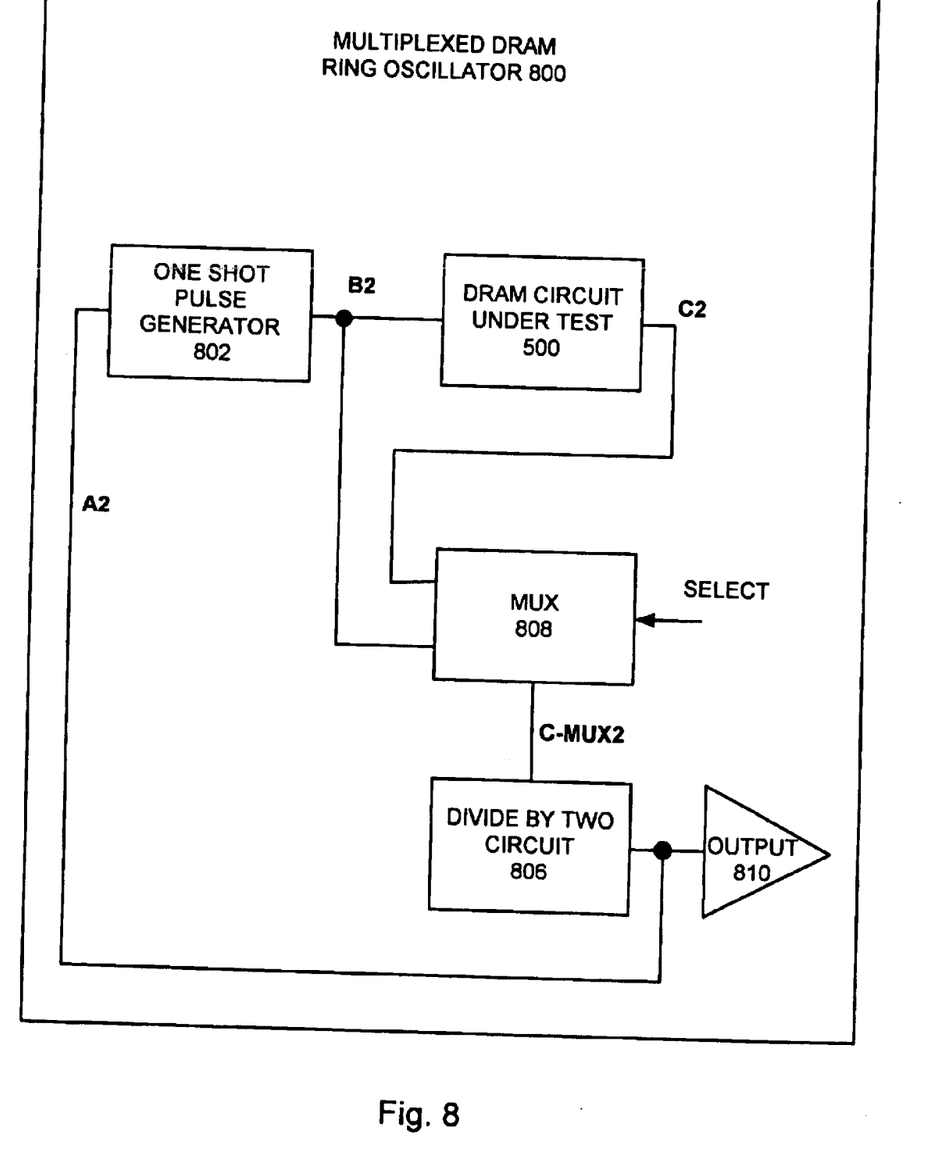
FIG. 8 shows a DRAM ring oscillator suitable to determine performance of the DRAM circuit under test. A multiplexer has been provided in this ring oscillator.

Briefly, DRAM circuit under test 500 shown in FIG. 5, used in DRAM ring oscillator 700 or multiplexed DRAM Ring oscillator 800, has INPUT 522 coupled to an output of one-shot pulse generator 702 in FIG. 7 or one-shot pulse generator 802 in FIG. 8. The signals driven by the outputs of one-shot pulse generators 702 and 802 are labeled B1 and B2, respectively. DRAM circuit under test 500 receives a rising INPUT 522 from signal B1 (or B2) to provide a rising signal output, labeled C1 in FIG. 7, and C2 in FIG. 8. C1 is coupled directly to the input of divide by two circuit 706; C2 is coupled via multiplexer 808 to the input of divide by two circuit 806. Multiplexer 808 performs a function similar to multiplexer 408 in FIG. 4, passing a first signal or a second signal, under control of a SELECT signal.

It is key to understanding the operation of the ring oscillators of FIG. 7 and FIG. 8 that the frequency of the ring oscillator is determined only by the frequency of rising edges at the input of the divide by two circuit (706 in FIG. 7; 806 in FIG. 8). The frequency of the rising edges at the input of the divide by two circuit (706, 806) is primarily determined, as will be described below, by the time required to read data stored in the DRAM storage capacitor in DRAM circuit under test 500. Therefore the frequency of the ring oscillator is determined largely by the time required to read data stored in the DRAM storage capacitor. DRAM circuit under test 500 provides for a "write" of a "0" in the DRAM storage cell, with a subsequent read of the "0", the time required to read the "0" being a determinant of the frequency of the ring oscillator of FIG. 7 or FIG. 8.

FIG. 5 shows timing and control circuit 520, active DRAM storage cells 510A–510N, optional inactive (dummy) DRAM storage cells 512A–512N, and sense amp 502.

Figure 6A:
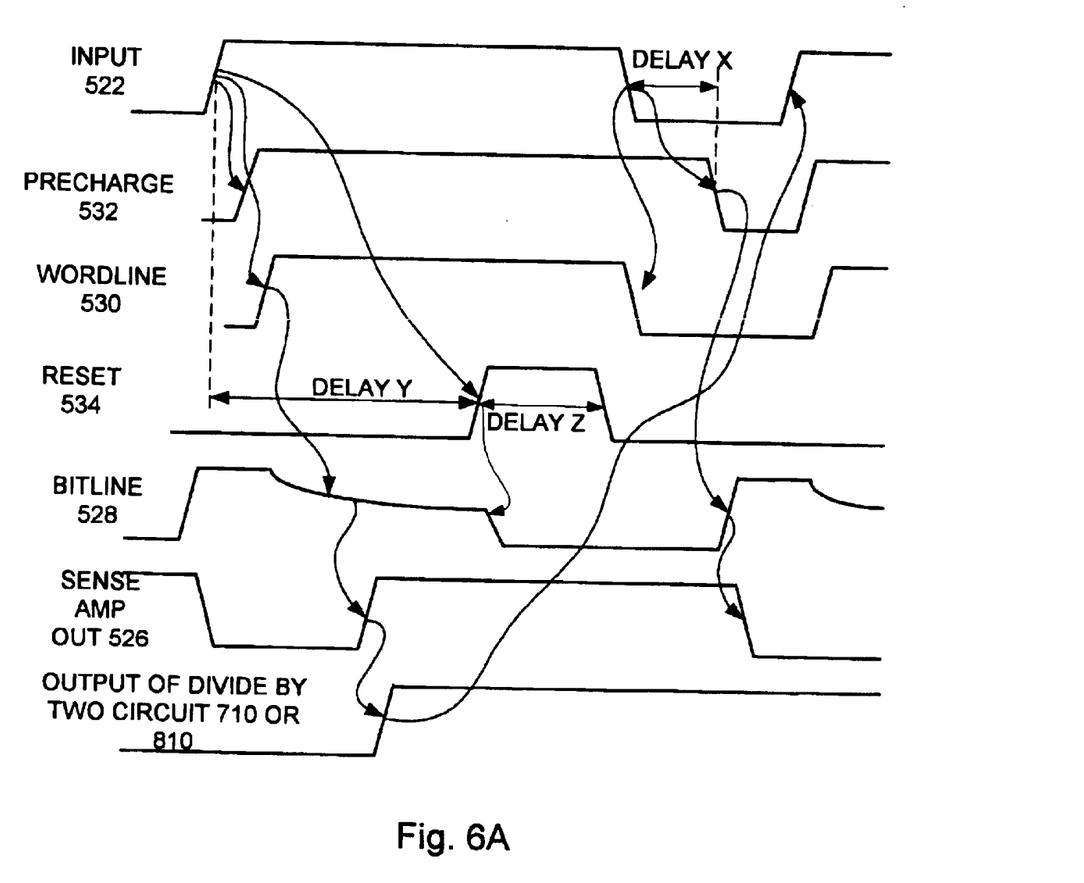
Figure 6B:
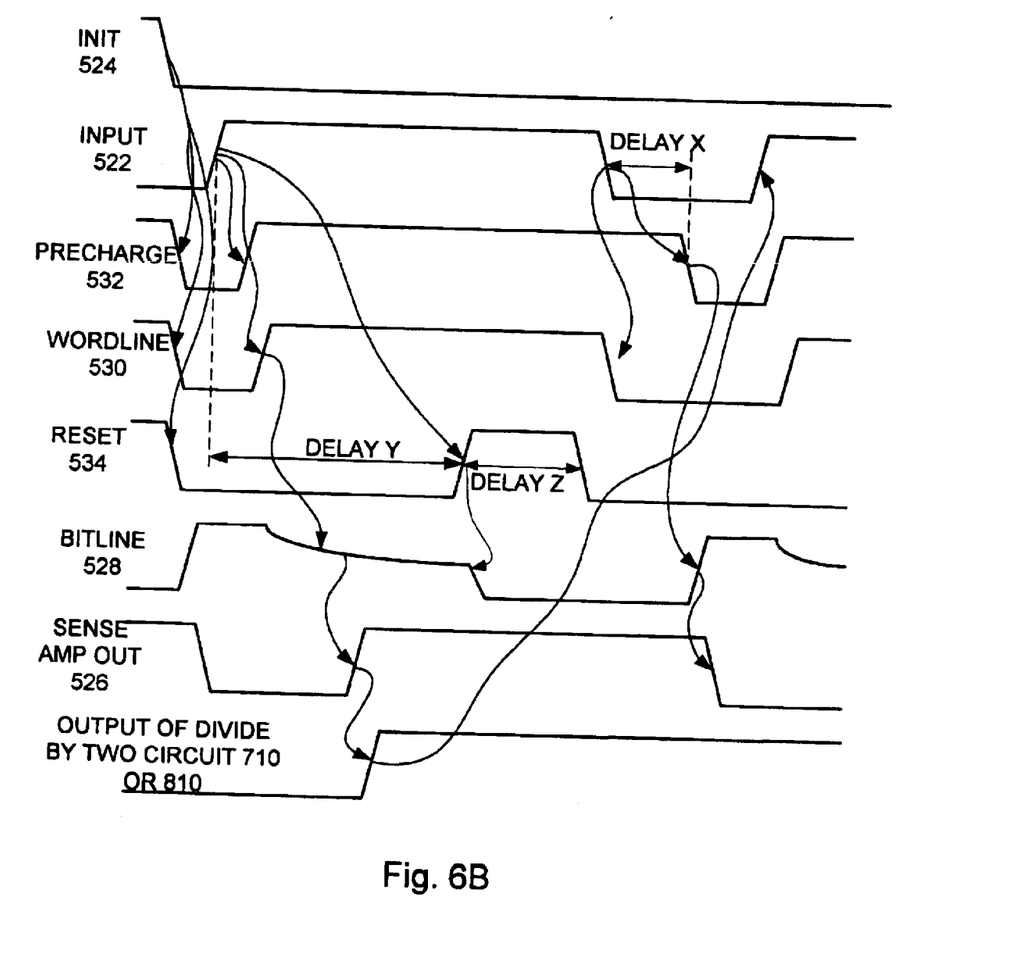
FIG. 6B shows a set of waveforms that would be seen in FIGS. 7 and 8, using the circuitry shown in FIG. 5 used as the "DRAM circuit under test".

An initialization input, INIT 524, is shown in FIG. 5. This signal is optional, and simply ensures a known starting condition for the circuit, as well as a means to halt the ring oscillator when INIT 524 is asserted. Absent INIT 524, the ring oscillator will begin oscillating properly within one or two cycles. Typically, ring oscillator frequency is observed over a relatively long period of time, so that startup transients are not important. If INIT 524 is not implemented, simple inverters are used in place of NANDs 506, 507, and 508; inverter 503 is eliminated. FIG. 6A shows waveforms of DRAM circuit under test 500 after oscillations have begun. FIG. 6B shows waveforms of DRAM circuit under test 500 being initialized by INIT 524.

In operation, INPUT 522 rises, initiating a "read" from DRAM storage cells 510A–510N.

A first circuit within DRAM circuit under test 500, which drives PRECHARGE, comprises NOR 502, NAND 506, and DELAYX. In an embodiment utilizing INIT 524, inverter 503 provides an input to the first circuit.

INPUT 522 is the main input (and in some embodiments, the only input) to timing and control circuit 520, and is also referred to as a "timing and control input".

INPUT 522 rising drives PRECHARGE 532 "high", turning off QP, which had driven BITLINE 528 "high". QP must not drive BITLINE 528 during a read. BITLINE 528 must be "floated" (i.e., neither driven actively "high" or "low") in order that proper charge redistribution between BITLINE 528 and the storage capacitor can occur.

A second circuit within DRAM circuit under test 500, which drives WORDLINE 530, comprises inverter 501 and NAND 508. In an embodiment utilizing INIT 524, inverter 503 provides an input to the second circuit.

INPUT 522 rising drives WORDLINE 530 high. Proper design will have WORDLINE 530 rising after PRECHARGE 532 has shut off QP.

WORDLINE 530 rising turns on DRAM transistors in as many DRAM storage cells 510A–510N as are connected to WORDLINE 530. Turning on a DRAM transistor during a read, as described earlier, causes charge redistribution between BITLINE 528 and the storage capacitor in the DRAM storage cell through the DRAM transistor and the strap resistance. BITLINE 528 is seen in FIG. 6A to fall as charge is redistributed after WORDLINE 530 has risen. The time required to redistribute charge from the precharged BITLINE 528 to the storage capacitor to a voltage recognized by sense amp 502 dominates the "read" time of the DRAM storage cell.

In an embodiment, only a single DRAM storage cell 510A is driven by WORDLINE. Typically, in an operational DRAM, only one DRAM storage cell 510A on a particular BITLINE 528 is activated by a particular WORDLINE 530. Typically, charge redistribution when reading a "0" causes BITLINE 528 to fall only about 10%. That is, BITLINE 528 would remain at about 90% of the voltage to which it was precharged. In this case, an accurate sense amp 502 is required to sense that the read operation has completed. Such a sense amp 502 could be designed as a differential amplifier (not shown), with a reference input coupled to a voltage divider. The voltage divider is designed to provide a reference voltage equal to the voltage at which the BITLINE 528 voltage becomes low enough to be interpreted as a "low" logic level. For example, if the BITLINE 528 is expected to ultimately fall to 90% of Vdd, the reference voltage might be designed to be 93% of Vdd. The numbers 90% and 93% are exemplary only, and actual values in a particular design can and do vary significantly.

In another embodiment, a number of DRAM storage cells 510A–510N are coupled to WORDLINE 530. This embodiment provides a larger total amount of capacitance that will redistribute charge from the precharged BITLINE 528. As more DRAM storage cells 510A–510N are added, therefore, BITLINE 528 will fall further when WORDLINE 530 rises. A larger voltage swing on BITLINE 528 when WORDLINE 530 rises allows a simpler sense amplifier 502. For example, in an embodiment wherein a relatively large number of DRAM storage cells 510A–510N are used, a simple Complementary Metal Oxide Semiconductor (CMOS) inverter is suitable to detect the larger voltage swing.

DRAM storage cells 512A–512N are optional, are not switched, and serve to provide a typical amount of capacitance on BITLINE 528 that is used in a DRAM. For example, if a chip is dependent on delay of a DRAM in which a BITLINE 528 is coupled to 64 DRAM storage cells, advantageously, DRAM circuit under test 500 would have approximately 64 DRAM storage cells coupled to BITLINE 528, with one or more coupled to WORDLINE 530, as described earlier with DRAM storage cells 510A–510N; the corresponding WORDLINE ports of other DRAM storage cells coupled to a voltage supply such as ground, as shown for DRAM storage cells 512A–512N.

As shown in FIG. 6A, after some period of time after WORDLINE 530 rises, during which the storage capacitors of DRAM storage cells 510A–510N are being charged from BITLINE 528, the voltage on BITLINE 528 falls far enough that Sense Amp 502 detects a low logic level, and responds by raising its output, called Sense Amp Out 526 in FIG. 6A. This output drives signal C1 in FIG. 7, and C2 in FIG. 8.

Note that although the fall time of BITLINE 528 in FIGS. 6A and 6B is shown to be similar in delay to the delays of the conventional logic blocks, which are advantageously designed in high-speed logic circuitry, this is only for clarity in showing relationship between signals in the figures. The fall time of BITLINE 528 during a "read" is typically many times longer than delays of high-speed logic blocks depicted (i.e., blocks 501, 502, 503, 504, 506, 507, and 508).

A divide by two circuit 706 in FIG. 7 responds to the rising edge of sense amp out 526 (C1) by changing state. In FIG. 8, sense amp out 526 (C2) is coupled to divide by two circuit 806 through multiplexer 808. A transition at the output of divide by two circuit (706 or 806) causes one-shot pulse generator (702 or 802) to again produce a pulse (i.e., B1 or B2) that is coupled to DRAM Circuit under test 500 whereupon the cycle repeats.

A third circuit in DRAM circuit under test 500, which drives RESET 534, comprises DELAY Y, DELAY Z, NAND 504, and NAND 507. In an embodiment utilizing INIT 524, inverter 503 provides an input to the third circuit.

The storage capacitor in DRAM storage cells 510A–510N must be discharged before the next cycle can begin in order that the next read is also a "0" read. Turning transistor QN on with a RESET 534 signal provides this discharge. DELAY Y, inverting DELAY Z, NAND 504 and NAND 507, generate signal RESET 534. The following assumes that INIT 524 is inactive. When INPUT 522 has been "low" for a time period exceeding DELAY Y, a first input to NAND 504 is "low". Inverting DELAY Z provides a "high" to a second input of NAND 504. When INPUT 522 rises, the first input of NAND 504 rises after a DELAY Y, causing the output of NAND 504 to fall. NAND 507's output (RESET 534) rises in response to the output of NAND 504 falling, turning QN on. However, after a DELAY Z time period, the second input to NAND 504 falls, causing the output of NAND 504 to rise. NAND 507 responds by causing RESET 534 to fall, turning QN off. FIG. 6 shows BITLINE 528 being discharged completely by QN when RESET 534 rises for the time length determined by DELAY Z. DELAY Z must be long enough in duration to ensure substantially complete discharge of BITLINE 528. DELAY Y must be long enough in duration to ensure that BITLINE 528 has discharged in the charge redistribution process enough that sense amplifier 502 detects a "low" logic level.

DELAY X ensures that WORDLINE 530 falls prior to PRECHARGE 532 becoming active. If WORDLINE 530 fell at the same time (or later than) PRECHARGE 532 falls, some charge might be placed on the storage capacitors of DRAM storage cells 510A–510N, which must be substantially completely discharged at the beginning of the cycle.

DELAY X, DELAY Y, and DELAY Z can be implemented using any of a number of well-known delay techniques, including chains of logic circuits (e.g., inverters, NANDs, NORs), "RC" delays in which a capacitor is charged through a resistor, or use of transmission lines of predetermined lengths and known signal velocities.

The exemplary embodiments shown above have chosen a particular choice of transition—rising—direction to determine the frequency of the ring oscillator of the invention. The invention's spirit and scope includes using falling transitions as well. The invention's spirit and scope includes any use of a ring oscillator in which a DRAM storage cell's delay is a determinant of the frequency of the ring oscillator.

While the present invention has been described with reference to the details of the embodiments of the invention shown in the drawings, these details are not intended to limit the scope of the invention as claimed in the appended claims.

What is claimed is:

1. A semiconductor chip comprising:
    a DRAM ring oscillator with a frequency; and
    a Dynamic Random Access Memory (DRAM) circuit under test coupled serially in the DRAM ring oscillator, the DRAM circuit under test further comprising a DRAM storage cell having a bitline port and a wordline port;
    wherein the DRAM circuit under test is a determinant of the frequency.

2. The semiconductor chip of claim 1, wherein the DRAM ring oscillator further comprises:
    a one-shot pulse generator, and
    a divide by two circuit.

3. The semiconductor chip of claim 2, wherein the DRAM ring oscillator further comprises:
    an output of the one-shot pulse generator coupled to an input of the DRAM circuit under test;
    an output of the DRAM circuit under test coupled to an input of the divide by two circuit; and
    an output of the divide by two circuit coupled to an input of the one-shot pulse generator.

4. The semiconductor chip of claim 3, wherein the DRAM ring oscillator further comprises:
    a multiplexer comprising:
    a first multiplexer input coupled to the output of the DRAM circuit under test;
    a second multiplexer input coupled to the output of the one-shot pulse generator,
    a multiplexer output coupled to the input of the divide by two circuit; and
    a select input suitable to control whether the first multiplexer input or the second multiplexer input is gated to the multiplexer output.

5. The semiconductor chip of claim 3, wherein the DRAM circuit under test further comprises:
    a timing and control circuit having an timing and control input coupled to the output of the single-shot pulse generator, a bitline output coupled to the DRAM storage cell bitline port, and a wordline output coupled to the DRAM storage cell wordline port.

6. The semiconductor chip of claim 5, wherein the DRAM circuit under test further comprises a sense amplifier having a sense amplifier input coupled to the bitline output, and a sense amplifier output, the sense amplifier suitable for driving a logic level on the sense amplifier output respondent to a voltage level on the sense amplifier input.

7. The semiconductor chip of claim 5 wherein the timing and control circuit further comprises:
    a first circuit that activates a precharge of the bitline output respondent to a first transition of the timing and control input, and ends the precharge of the bitline output respondent to a second transition of the timing and control input;
    a second circuit that activates a wordline output after the bitline output precharge has ended, and deactivates the wordline output prior to the bitline output being activated again; and
    a third circuit that resets the bitline output prior to when the wordline output is deactivated.

8. The semiconductor chip of claim 5, in which the DRAM circuit under test further comprises at least one instance of an inactive DRAM storage cell a wordline port of the inactive DRAM storage cell being coupled to a voltage supply that maintains a DRAM transistor in the inactive DRAM storage cell in a nonconducting state; a bitline port of the inactive DRAM storage cell being coupled to the bitline output.

9. A method of characterizing the performance of a dynamic access random access memory (DRAM), comprising the steps of:
    providing a DRAM circuit under test comprising a DRAM storage cell as a frequency-determinant portion of a DRAM ring oscillator;
    applying a voltage supply to the DRAM ring oscillator, and
    measuring the frequency of the DRAM ring oscillator.

10. The method of claim 9, wherein the step of providing the DRAM circuit under test as a frequency-determinant portion of the DRAM ring oscillator further comprises the steps of:
    coupling an output of the DRAM circuit under test to an input of a divide by two circuit;
    coupling an input of a one-shot pulse generator to an output of the divide by two circuit; and
    coupling an output of the one-shot pulse generator to an input of the DRAM circuit under test.

11. The method of claim 9, wherein the step of providing the DRAM circuit under test as a frequency-determinant portion of the DRAM ring oscillator further comprises the steps of;
    coupling an output of the DRAM circuit under test to a first input of a multiplexer;
    coupling an output of the multiplexer to an input of a divide by two circuit; coupling an input of a one-shot pulse generator to the output of the multiplexer;

coupling an output of the one-shot pulse generator to an input of the DRAM circuit under test and also to a second input of the multiplexer; and coupling a select signal to the multiplexer, the select signal capable of controlling whether the first multiplexer input or the second multiplexer input is gated to the multiplexer output.

12. The method of claim 11, further comprising the steps of:

operating the DRAM ring oscillator with the select signal passing the output of the DRAM circuit under test through the multiplexer, and measuring a first frequency of the DRAM ring oscillator;

operating the DRAM ring oscillator with the select signal passing the output of the one-shot pulse generator through the multiplexer, and measuring a second frequency of the DRAM ring oscillator; and computing a delay through the DRAM circuit under test using a difference between the first frequency of the DRAM ring oscillator and the second frequency of the DRAM ring oscillator.

13. The method of claim 9, further comprising the step of including one or more inactive DRAM storage cells in the DRAM circuit under test.

* * * * *